United States Patent [19]
Loeppert et al.

[11] Patent Number: 5,861,779
[45] Date of Patent: *Jan. 19, 1999

[54] IMPEDANCE CIRCUIT FOR A MINIATURE HEARING AID

[75] Inventors: Peter V. Loeppert, Hoffman Estates; Steven E. Boor, Lombard, both of Ill.

[73] Assignee: Knowles Electronics, Inc., Itasca, Ill.

[ * ] Notice: The term of this patent shall not extend beyond the expiration date of Pat. No. 5,446,413.

[21] Appl. No.: 742,287

[22] Filed: Nov. 4, 1996

Related U.S. Application Data

[63] Continuation-in-part of Ser. No. 247,136, May 20, 1994, Pat. No. 5,446,413.

[51] Int. Cl.⁶ .................................................. H03F 3/185
[52] U.S. Cl. .......................... 330/277; 330/256; 381/120
[58] Field of Search ..................................... 330/277, 296; 381/69.1, 120, 121

[56] References Cited

U.S. PATENT DOCUMENTS

| | | |
|---|---|---|
| 3,448,397 | 6/1969 | Lin et al. . |
| 3,512,100 | 5/1970 | Killion et al. . |
| 3,601,625 | 8/1971 | Redwine et al. . |
| 3,823,332 | 7/1974 | Feryszka et al. . |
| 4,063,050 | 12/1977 | Carlson et al. . |
| 4,068,090 | 1/1978 | Komatsu et al. . |
| 4,068,140 | 1/1978 | Lou . |
| 4,151,480 | 4/1979 | Carlson et al. . |
| 4,495,384 | 1/1985 | Scott et al. . |
| 4,509,193 | 4/1985 | Carlson . |
| 4,539,441 | 9/1985 | Eggert et al. . |
| 4,764,690 | 8/1988 | Murphy et al. . |
| 4,776,019 | 10/1988 | Miyatake . |
| 4,896,121 | 1/1990 | Larson . |
| 4,922,471 | 5/1990 | Kuehnel . |
| 5,097,515 | 3/1992 | Baba . |
| 5,105,102 | 4/1992 | Shioda . |
| 5,146,435 | 9/1992 | Bernstein . |
| 5,192,920 | 3/1993 | Nelson et al. . |
| 5,192,990 | 3/1993 | Stevens . |
| 5,194,831 | 3/1993 | Jackson . |
| 5,208,867 | 5/1993 | Stites, III . |
| 5,255,246 | 10/1993 | Van Halteren . |
| 5,303,210 | 4/1994 | Bernstein . |
| 5,408,534 | 4/1995 | Lenzini et al. . |
| 5,446,413 | 8/1995 | Loeppert et al. . |
| 5,506,544 | 4/1996 | Staudinger et al. ................. 330/296 X |
| 5,559,892 | 9/1996 | Boor . |

FOREIGN PATENT DOCUMENTS

| | | |
|---|---|---|
| 2105147 | 3/1983 | United Kingdom . |
| W/O 95/26617 | 10/1995 | WIPO . |
| W/O 95/32547 | 11/1995 | WIPO . |
| W/O 96/05711 | 2/1996 | WIPO . |

OTHER PUBLICATIONS

A.G.H. Van Der Donk, J. A. Voorthuyzen and P. Bergveld; General Considerations of Noise in Microphone Preamplifiers,: Mar. 1991, Journal: Sensors and Actuators, vol. A26, Nos. 1–3, pp. 515–520.

Armand G.H. van der Donk, Piet Bergveld and Johannes A. Voorthuyzen; "Optimal Design of an Electret Microphone Metal–Oxide–Semiconductor Field–Effect Transistor Preamplifier," Apr. 1992, Acoustical Society of America, pp. 2261–2269.

*Primary Examiner*—James B. Mullins
*Attorney, Agent, or Firm*—Wallenstein & Wagner, Ltd.

[57] ABSTRACT

An impedance matching, reducing, or buffering circuit for permitting smooth signal flow from a first transmission medium to a second transmission medium. The circuit provides a first node adapted for coupling to the first transmission medium and for receiving a signal from the first transmission medium. The circuit further provides a buried channel transistor, that is coupled to the first node and that is biased by additional circuit devices, for transforming the impedance imposed on the signal. The use of the buried mode transistor reduces noise on the surface of the transistor while at the same time keeps other performance standards high. The circuit additionally provides a second node that is coupled to the buried channel transistor and that is adapted for coupling to the second transmission medium for conveying the signal to the second transmission medium.

33 Claims, 2 Drawing Sheets

IMPEDANCE CIRCUIT FOR A MINIATURE HEARING AID

RELATED APPLICATIONS

This application claims priority from International Application No. PCT/US95/06164 filed May 19, 1995, which is a continuation-in-part of U.S. patent application Ser. No. 08/247,136, filed May 20, 1994, and which issued on Aug. 29, 1995, as U.S. Pat. No. 5,446,413.

TECHNICAL FIELD

The present invention relates generally to impedance reduction and/or impedance buffering within electrical circuits. More particularly, this invention relates to impedance reduction and/or buffering circuits for use within miniature hearing aid devices that are designed for high performance, low noise, and reduced size.

BACKGROUND PRIOR ART

The general construction of hearing aids usually includes a microphone portion, an amplification portion, and a receiver portion. The microphone portion picks up sound waves in audible frequencies and creates an electronic signal representative of these sound waves. The amplification portion takes the electronic signal and amplifies the signal, and then sends the amplified signal to the receiver portion. The receiver portion produces enhanced original sound waves that are easier to hear than the original sound waves. Thus, a hearing aid user benefits from the enhanced sound waves.

Although hearing aid users benefit from the increased ability to hear sounds that surround them, prior art hearing aids were problematic in that they were fairly large. In particular, when a hearing aid was worn by a user, either in front or behind the ear, the hearing aid was visible by an observer. Furthermore, even when the hearing aid was recessed and a tube extended from the hearing aid into a user's ear, the tube was still visible by an observer. Thus, a hearing aid user often would not want to wear a hearing aid at all, when the hearing aid or tube extending into the user's ear was visible by an observer.

Thus, there has been a goal in the industry to create a smaller and smaller hearing aid which would fit into an ear canal, yet perform at the same or higher levels of performance than the larger hearing aid devices. Smaller hearing aids require smaller transducers which, in the case of microphones, means less source capacitance. As a result, the front ends of the amplifier portion 3, must have very high resistances and very low input capacitances in order to match or buffer to the source impedance. It is well known that Metal Oxide Semiconductor Field Effect Transistor (MOSFET) technology offers higher gain and lower capacitance per unit area than Junction Field Effect Transistor (JFET) technology. Hearing aid microphones have traditionally used JFET front ends to achieve low noise. However, the push to smaller sizes makes the use of MOSFETs attractive. Specifically, the prior art used enhancement mode MOSFETs, Complimentary MOS transistors (CMOS), and/or other types of enhancement mode devices at the front end of the amplifier portion or after the microphone portion of these hearing aids. example, see Murphy et al. U.S. Pat. No. 4,764,690). At the very least, this is done to reduce the overall size of the hearing aid device and to additionally reduce power consumption when CMOS technology is used.

However, problems arise when enhancement mode devices are used at the front end of the amplifier portion of a hearing aid device. Specifically, when a voltage is applied to turn on (or enhance) an enhancement mode device, carriers from the source to the drain of the device are conducted along the surface wherein the surface is the physical separation between the two dissimilar materials of silicon and silicon dioxide. As the carriers are conducted along the surface, trapping and releasing of carriers occur based on the vertical field between the gate and the channel, as is commonly known in the art. Therefore, there is always some component of electrical field pulling the carriers toward the surface, causing trapping and releasing at the surface. This trapping and releasing results in an approximately 1/f noise; f being the frequency of the noise.

At higher frequencies, one gets lower relative noise. However, at lower frequencies, frequencies commonly requiring the assistance of a hearing aid device, a relatively large amount of noise is produced from the trapping and releasing due to the conduction of carriers in the conduction channel of the enhancement mode transistor. The commonly known method of reducing the previously mentioned noise incorporates making the size of the enhancement mode devices very large so that the noise is integrated out by the increased area of the transistors. However, making large devices within the circuitry is contrary to the basic goal of creating smaller hearing aid devices.

Hence, when a signal is produced by a microphone, the impedance of the microphone must be matched or buffered to the transmission medium which receives the signal. Generally, as previously mentioned, in the case if a hearing aid, the microphone portion impedance must appropriately buffered to the amplifier portion impedance in order for efficient amplification to occur.

Thus, it is an object of the present invention to provide a circuit to match the impedance of the microphone portion and the amplifier portion of a hearing aid. This object is accomplished while, at the same time, solving the noise, size, and other problems of the prior art. This invention, while solving these problems of the prior art, also maintains the same or higher level of performance as the prior art.

SUMMARY OF THE INVENTION

The present invention is an impedance matching, reduction, or buffer circuit that permits smooth signal flow from a first transmission medium to a second transmission medium. The impedance circuit includes a first node that is adapted for coupling to the first transmission medium. The first node receives a signal from the first transmission medium. The impedance circuit also includes a buried channel transistor that is coupled to the first node and is used for transforming the impedance imposed on the signal. The impedance circuit further includes a second node that is coupled to the buried channel transistor and is adapted for coupling to the second transmission medium. The second node is the point at which the signal is conveyed to the second transmission medium.

In one embodiment of the invention, the impedance circuit further includes a biasing portion that is coupled to the buried channel transistor, the first node, and the second node. The biasing portion comprises a configuration that is responsive to the buried channel transistor, and is responsive to the signal when the signal is in a transient state. The impedance circuit further includes a resistor that is coupled to the biasing portion, and is coupled to the buried channel transistor. The resistor is used for creating a bias current for the buried channel transistor.

In operation, when a voltage source is applied, to the buried channel transistor, instead of trapping and releasing occurring along the surface of the transistor, the conduction occurs beneath the surface. Since the conduction occurs beneath the surface, a significantly less amount of noise is created, and impedance matching can take place without noise significantly affecting the signal. In further operation, the buried channel transistor creates a high impedance at the first node, and creates a low impedance at the second node based on the buried channel transistor's inherent structure. Thus, the impedance is reduced and excessive noise is not produced while the other standards of performance are kept at a high level.

For a better understanding of the invention, reference may be had to the following specification taken in conjunction with the following drawing. Furthermore, other features and advantages of the invention will be apparent from the following specification taken in conjunction with the following drawing.

DETAILED DESCRIPTION

Figure 1:
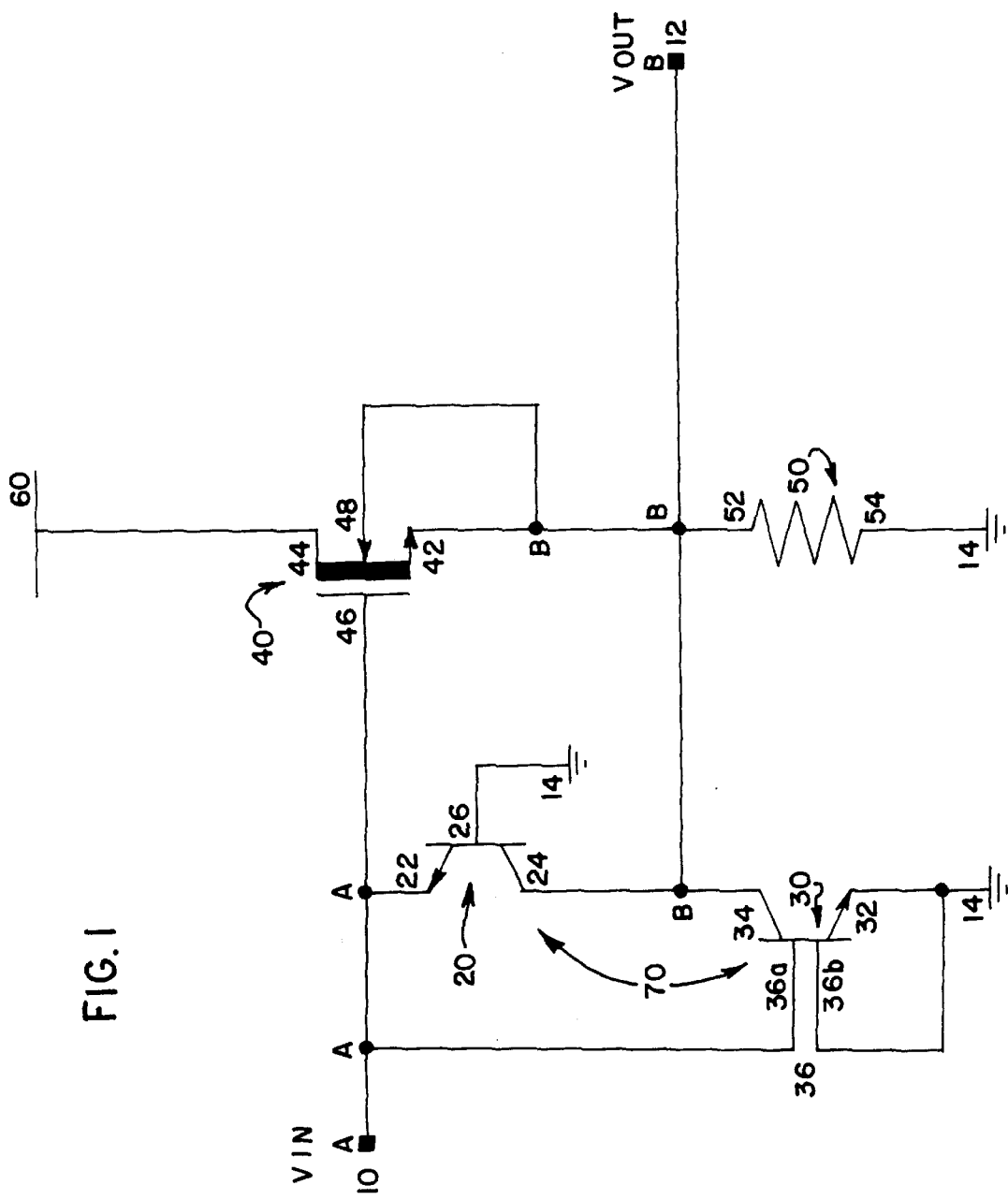
FIG. 1 is a schematic drawing of one embodiment of the impedance circuit of the present invention; and, FIG. 2 is a schematic diagram of another embodiment of the impedance circuit of the present invention.

While this invention is susceptible of embodiments in many different forms, there is shown in the drawings and will herein be described in detail, a preferred embodiment of the invention with the understanding that the present disclosure is to be considered as an exemplification of the principles of the invention and is not intended to limit the broad aspects of the invention to the embodiment illustrated.

FIG. 1 shows an impedance circuit for reducing/buffering the impedance between a first transmission medium and a second medium. In a hearing aid, the first transmission medium can, at least, represent a microphone portion (not shown) and/or the medium of transmission which the microphone portion creates in operation. Further in a hearing aid, the second transmission medium can, at least, represent the amplifier portion (not shown) and/or the medium of transmission which the amplifier portion requires for satisfactory operation. When the impedance circuit is in use, VIN is the signal that is received from the first transmission medium of the hearing aid, and VOUT is the signal that is conveyed along to the second transmission medium.

Figure 2:
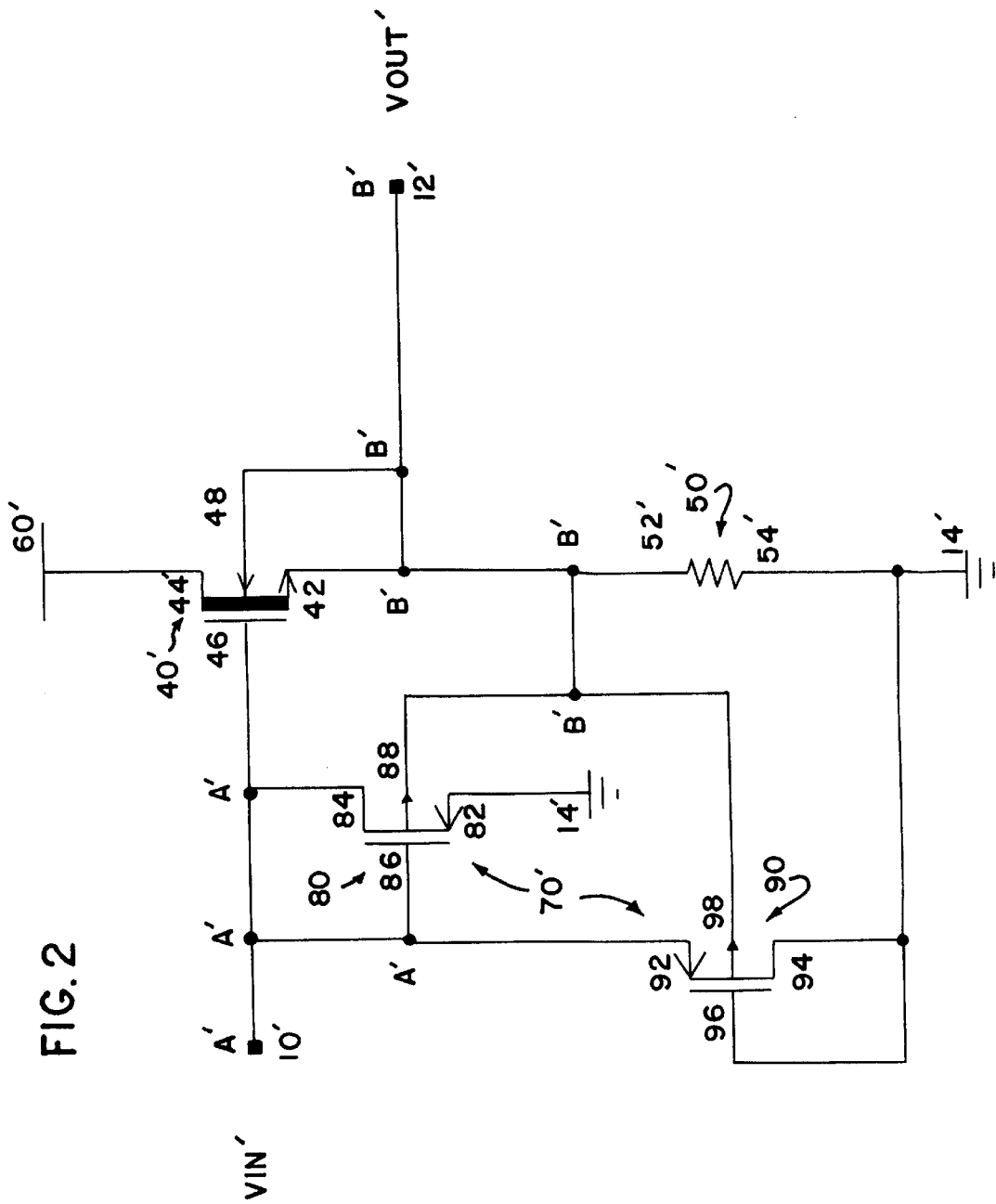

FIG. 1 further shows a first transistor 20 that is used in conjunction with a second transistor 30 for biasing a third transistor 40. The first and second transistors 20, 30 together, generally, make up what can be referenced as a biasing portion 70. The biasing portion 70 can alternatively comprise devices that are used to bias transistors generally, as is well known. Such biasing devices can include very large resistors, typically in the giga-ohm range, or diodes. However, FIG. 1 includes one embodiment in which the first and second transistors 20, 30 are Bi-Polar-Junction Transistors (BJTs). Although BJTs are used in FIG. 1, MOSFETs or other types of transistors can also be used to bias the third transistor 40, as is shown in FIG. 2 and described later within this specification.

In summary, the requirement is to establish a DC bias point while maintaining very high input impedance.

Within the impedance circuit generally disclosed in FIG. 1, the first transistor 20 includes one emitter terminal 22, one base terminal 26, and one collector terminal 24. In addition, the second transistor 30 includes one emitter terminal 32, one base terminal 36, and one collector terminal 34.

The third transistor or buried channel transistor 40 in FIG. 1 is a conventional device, such as a depletion mode n-channel transistor, which is fabricated so that a depletion region exists above the channel as can be achieved by one of ordinary skill in the art. This type of fabrication minimizes trapping and releasing at the surface. Thus, noise created through trapping and releasing does not occur at the surface when the third transistor is in operation.

The third transistor 40 can be an n-type depletion mode MOSFET. The third transistor 40 has a width equal to one hundred 100 microns and a length equal to three 3 microns. In one form of the impedance circuit in FIG. 1, the third transistor 40 includes at least one drain terminal 44, at least one backside terminal 48, at least one source terminal 42, and at least one gate terminal 46. The drain terminal 44 of the third transistor 40 is coupled to a voltage source 60. A first node (A) couples the emitter terminal 22 of the first transistor 20 to the gate terminal 46 of the third transistor 40. The first node (A) also couples the emitter terminal 22 of the first transistor 20 and the gate terminal 46 of the third transistor to the first transmission medium. The first node (A) further couples the base terminal 36 to the emitter 22 of the first transistor 20 and the gate 46 of the third transistor 40.

In the embodiment in FIG. 1, a second node (B) couples the collector terminal 24 of the first transistor 20 to the collector terminal 34 of the second transistor 30. The second node (B) also couples the source terminal 42 and the backside terminal 48 of the third transistor 40 together. The second node (B) additionally couples the two respective collector terminals 24, 34 of the first and second transistors 20, 30 to the source and backside terminals 42, 48 of the third transistor 40. Furthermore, the second node (B) couples the two collector terminals 24, 34 of the first and second transistors 20, 30, and the source and backside terminals 42, 48 of the third transistor 40 to the second transmission medium.

The impedance circuit in FIG. 1 further includes a resistor 50 which, in conjunction with the first and second transistors 20, 30, creates an appropriate bias current for the third transistor 40. The second node (B) couples a first end 52 of the resistor 50 to the respective second node (B) coupled terminals 24, 34, 42, and 48, and to the second transmission medium. The second end 54 of the resistor 50 is coupled to ground 14. The value of the resistor 50 can be 22K ohms in one embodiment of the invention.

As an alternative, resistor 50 can be replaced by a current source. Further, in the impedance circuit in FIG. 1, the base terminal 26 of the first transistor 20 is coupled to ground 14. In addition, first and second transistors 20 and 30 function as diodes to establish the DC bias of node A. It should be appreciated that each of the transistors may have more than one terminal of the same type.

Turning to FIG. 2, an additional embodiment of the impedance circuit is disclosed for reducing/buffering the impedance between a first transmission medium and a second medium. All common elements between FIG. 1 and FIG. 2, which are numbered, will be listed with a prime (') in FIG. 2. Again, in a hearing aid, the first transmission medium can, at least, represent a microphone portion (not shown) and/or the medium of transmission which the microphone portion creates in operation. Further in a hearing aid, the second transmission medium can, at least, represent the amplifier portion (not shown) and/or the medium of transmission which the amplifier portion requires for satisfactory operation. When the impedance circuit is in use, VIN' of FIG. 2 is the signal that is received from the first transmission medium of the hearing aid, and VOUT' of FIG. 2 is the signal that is conveyed along to the second transmission medium.

FIG. 2 further shows a first transistor 80 that is used in conjunction with a second transistor 90 for biasing a third transistor 40'. The first and second transistors 80, 90 together, generally, make up what can be referenced as a biasing portion 70'. The biasing portion 70' can alternatively comprise other devices for biasing the third transistor 40', as is well known. Such biasing devices can include very large resistors, typically in the giga-ohm range, or diodes. However, FIG. 2 includes one embodiment in which the first and second transistors 80, 90 are enhancement mode p-channel (PMOS) MOSFETs. Although enhancement mode PMOS MOSFETs are used in FIG. 2, other types of MOSFETs, including enhancement mode n-channel (NMOS) MOSFETs, and depletion mode NMOS and PMOS MOSFETs, or other types of transistors, can also be used to bias the third transistor 40'. In summary, as explained above, the requirement is to establish a DC bias point while maintaining very high input impedance.

Within the impedance circuit generally disclosed in FIG. 2, the first transistor 80 includes a source terminal 82, a drain terminal 84, a gate terminal 86, and a backside terminal 88. In addition, the second transistor 90 includes a source terminal 92, a drain terminal 94, a gate terminal 96, and a backside terminal 98.

The third transistor or buried channel transistor 40' in FIG. 2 is a conventional device, such as a depletion mode n-channel (NMOS) transistor, which is fabricated so that a depletion region exists above the channel as can be achieved by one of ordinary skill in the art. Again, this type of fabrication minimizes trapping and releasing at the surface. Thus, noise created through trapping and releasing does not occur at the surface when the third transistor 40' is in operation.

The third transistor 40' in FIG. 2 can be an n-type depletion mode MOSFET. The third transistor 40' in FIG. 2 has a width equal to one hundred (100) microns and a length equal to 3.6 microns. In one form of the impedance circuit in FIG. 2, the third transistor 40' includes a source terminal 42', a drain terminal 44', a gate terminal 46', and a backside terminal 48'. The drain terminal 44', of the third transistor 40' is coupled to a voltage source 60'. A first node (A') couples the drain terminal 84 of the first transistor 80 to the gate terminal 46' of the third transistor 40'. The first node (A') also couples the drain terminal 84 of the first transistor 80 and the gate terminal 46' of the third transistor 40' to the first transmission medium. The first node (A') further couples the source terminal 92 of the second transistor 90 to the gate terminal 86 and drain terminal 84 of the first transistor 80 and the gate 46' of the third transistor 40'.

Additionally, in the embodiment in FIG. 2, a second node (B') couples the backside terminal 88 of the first transistor 80 to the backside terminal 98 of the second transistor 90. The second node (B') also couples the source terminal 42' and the backside terminal 48' of the third transistor 40' together. The second node (B') additionally couples the two respective backside terminals 88, 98 of the first and second transistors 80, 90 to the source and backside terminals 42', 48' of the third transistor 40'. Furthermore, the second node (B') couples the two backside terminals 88, 98 of the first and second transistors 80, 90, and the source and backside terminals 42', 48' of the third transistor 40' to the second transmission medium. Additionally, the gate terminal 96 and the drain terminal 94 of the second transistor 90 are connected to ground 14'. In a preferred form of the embodiment of FIG. 2, the first and second transistors 80, 90 preferably each have a width of four (4) microns and a length of three (3) microns.

The impedance circuit in FIG. 2 further includes a resistor 50' which, in conjunction with the first and second transistors 80, 90, creates an appropriate bias current for the third transistor 40'. The second node (B') couples a first end 52' of the resistor 50'to the respective second node (B') coupled terminals 88, 98, 42', and 48', and to the second transmission medium. The second end 54' of the resistor 50' is coupled to ground 14'. The value of the resistor 50' can be 22K ohms in this embodiment of the invention.

As an alternative, resistor 50' can be replaced by a current source. Furthermore, in the impedance circuit in FIG. 2, the source terminal 82 of the first transistor 80 is coupled to ground 14'. It should be appreciated that each of the transistors may have more than one terminal of the same type.

The embodiment in FIG. 2 is generally preferable to the embodiment in FIG. 1 in the following respects. As described above, the biasing MOSFETs 80, 90 can be used to replace the NPN BJTs 20, 30, used to bias the gate 46' of the third transistor 40'. These biasing MOSFETs are also known as the biasing portion 70', and are PMOS devices in the FIG. 2 embodiment.

When PMOS devices are used as the biasing portion 70' (MOSFETs) to replace the biasing portion 70 from FIG. 1 (BJTs), the PMOS devices have been found to exhibit about ¼th as much (i.e. 75% less) loading capacitance than the BJTs at the input terminal 10' of the impedance circuit, while maintaining the same loading resistance as the BJTs in biasing portion 70 from FIG. 1. When used in the biasing portion 70, 70', both NPN (BJTs) and PMOS (MOSFETs) devices must have minimum physical size, in order to minimize their loading capacitance effects. The reduction in capacitance by use of PMOS devices comes directly from recognizing that, for the same device size, the loading capacitance of a device having a Silicon Dioxide dielectric (such as for a PMOS device) is ¼th the loading capacitance of a device having Silicon as its dielectric (such as for an NPN bipolar device).

The reduced loading capacitance of the PMOS devices results in improved performance for this impedance circuit via higher buffer gain (due to reduced loading capacitance at the input). It also results in a lower input referred noise while maintaining equal performance in all other areas. In general, these performance improvements can be obtained from using any MOS device including enhancement mode NMOS devices, depletion mode NMOS devices, enhancement mode PMOS devices, or depletion mode PMOS devices. The same types of devices or a combination of these devices could be used, so long as the devices used are biased properly. Nonetheless, as shown in FIG. 2, the enhancement mode devices are preferred within the biasing 70', since no additional circuitry is needed to achieve the bias requirements, but depletion mode devices could be used if additional circuitry (typically known as a charge pumps) were included to meet the bias requirements.

Both the embodiments from FIG. 1 and FIG. 2 are formed within a single substrate. In other words, the circuit elements and connections are fabricated into and onto a single substrate of semi-conductor material using well known fabrication concepts. There are numerous advantages of using a common or single substrate in the fabrication process, such as the ultimate smaller size of the circuit embodiment. Thus, it is usually most advantageous to use a single substrate to achieve the smallest feasible circuit, and the smallest feasible hearing aide.

It will be understood that the invention may be embodied in other specific forms without departing from the spirit or central characteristics thereof. Specificly, a single transistor can be used in combination with a diode or other circuit element (biasing elements) to make up the biasing portion 70, 70'. The present examples and embodiments, therefore, are to be considered in all respects as illustrative and not restrictive, and the invention is not to be limited to the details given herein.

We claim:

1. A circuit for reducing the output impedance of the circuit between a high impedance A.C. source and a low impedance load comprising:
   an input for coupling to the high A.C. impedance source for receiving an A.C. signal;
   means coupled to the input for transforming the impedance imposed on the signal comprising a buried channel transistor;
   an output coupled to the transforming means and for coupling to the low impedance load for conveying the signal to the low impedance load; and,
   D.C. biasing means coupled to the input side of the transforming means for imposing a D.C. bias on the transforming means while maintaining the high input impedance, the biasing means comprising two biasing elements including at least one transistor.

2. The circuit as claimed in claim 1, wherein the biasing elements are both transistors of the BJT type.

3. The circuit as claimed in claim 2, wherein the MOSFETs are of the enhancement mode type.

4. The circuit as claimed in claim 2, wherein the MOSFETs are of the PMOS type.

5. The circuit as claimed in claim 2, wherein each biasing MOSFET transistor includes a gate terminal, a source terminal, and a drain terminal, the gate terminal of one MOSFET transistor being connected to the source terminal of the other MOSFET transistor.

6. The circuit as claimed in claim 2 further comprising means, coupled to the biasing means and the transforming means, for creating a bias current for the transforming means.

7. The signal transformation circuit as claimed in claim 6, wherein the means for creating a bias current for the transforming means is a resistor of an appropriate value.

8. The circuit as claimed in claim 1 further comprising means, coupled to the biasing means and the transforming means, for creating a bias current for the transforming means.

9. The signal transformation circuit as claimed in claim 8, wherein the means for creating a bias current for the transforming means is a resistor of an appropriate value.

10. The circuit as claimed in claim 1, wherein the transforming means comprises a MOSFET of the depletion mode type.

11. The circuit as claimed in claim 1, wherein the circuit is fabricated on a single substrate.

12. An amplifier buffer circuit for transforming a signal generated by a first transmission medium with a high impedance so that a second transmission medium can further manipulate the signal in a miniature hearing aid comprising:
   means for receiving the signal generated by the first transmission medium;
   a depletion mode transistor having a buried channel which prevents trapping from occurring on the surface of the depletion mode transistor and which reduces noise in the operation of the depletion mode transistor device, the depletion mode transistor being coupled to the receiving means, the depletion mode transistor reducing the impedance between the first transmission medium and the second transmission medium;
   means coupled to the depletion mode transistor for conveying the signal to the second transmission medium; and,
   D.C. biasing means coupled to the depletion mode transistor for imposing a D.C. on the depletion mode transistor while maintaining the high impedance of the depletion mode transistor at the receiving means, the biasing means comprising two biasing elements including at least one transistor.

13. The circuit as claimed in claim 12, wherein the biasing elements are both transistors of the MOSFET type.

14. The circuit as claimed in claim 13, wherein the MOSFETs are of the enhancement mode type.

15. The circuit as claimed in claim 13, wherein the MOSFETs are of the PMOS type.

16. The circuit as claimed in claim 13, wherein each biasing MOSFET transistor includes a gate terminal, a source terminal, and a drain terminal, the gate terminal of one MOSFET transistor being connected to the source terminal of the other MOSFET transistor.

17. The amplifier buffer circuit as claimed in claim 13 further comprising means, coupled to the biasing means and coupled to the depletion mode transistor, for creating a bias current for the depletion mode transistor.

18. The signal transformation circuit as claimed in claim 17, wherein the means for creating a bias current for the depletion mode transistor is a resistor of an appropriate value.

19. The amplifier buffer circuit as claimed in claim 12 further comprising means, coupled to the biasing means and coupled to the depletion mode transistor, for creating a bias current for the depletion mode transistor.

20. The signal transformation circuit as claimed in claim 19, wherein the means for creating a bias current for the depletion mode transistor is a resistor of an appropriate value.

21. The amplifier buffer circuit as claimed in claim 12, wherein the depletion mode transistor is of the MOSFET type.

22. The circuit as claimed in claim 12, wherein the circuit is fabricated on a single substrate.

23. A circuit for reducing the impedance between a first A.C. transmission medium and a second transmission medium comprising:
   a first transistor having a gate, a source, a drain, and a backside terminal;
   a second transistor having a gate, a source, a drain, and a backside terminal;
   a third transistor having a buried channel, and having a gate, a source, a drain, and a backside terminal;
   a first coupling means for coupling the backside terminals of the first and second transistors to the source terminal of the third transistor, wherein the first coupling means includes an output for coupling to the second transmission medium; and,
   a second coupling means for coupling the gate terminal of the first transistor and the source terminal of the second transistor to the gate terminal of the third transistor, wherein the second coupling means includes an input for coupling to the first transmission medium.

24. The circuit as claimed in claim 23 further comprising means, coupled between ground and the first coupling means, for creating a bias current for the third transistor.

25. The circuit as claimed in claim 23, wherein the source terminal of the first transistor is coupled to ground.

26. The circuit as claimed in claim 23, wherein the drain terminal of the third transistor is coupled to a voltage source.

27. The circuit as claimed in claim 23, wherein the third transistor is a MOSFET of the depletion mode type.

28. The circuit as claimed in claim 23, wherein the second coupling means is also a means for coupling the drain terminal of the first transistor and the gate terminal of the third transistor to the first transmission medium.

29. The circuit as claimed in claim 23, wherein the first coupling means is also a means for coupling the backside terminal of the first transistor, the backside terminal of the second transistor, and the source terminal of the third transistor to the second transmission medium.

30. The circuit as claimed in claim 23, wherein the first coupling means is also a means for coupling the backside terminal of the first transistor, the backside terminal of the second transistor, and the source terminal of the third transistor to the backside terminal of the third transistor.

31. The circuit as claimed in claim 23, wherein the circuit is fabricated on a single substrate.

32. The circuit as claimed in claim 23, wherein the first and second transistors are of the enhancement mode type.

33. The circuit as claimed in claim 23, wherein the first and second transistors are of the PMOS type.

* * * * *